(12) United States Patent
Wei et al.

(10) Patent No.: US 9,231,519 B2
(45) Date of Patent: Jan. 5, 2016

(54) TEMPERATURE COMPENSATION FOR OSCILLATOR

(75) Inventors: Fangxing Wei, Portland, OR (US); Yongping Fan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 117 days.

(21) Appl. No.: 13/976,942

(22) PCT Filed: Mar. 13, 2012

(86) PCT No.: PCT/US2012/028955
§ 371 (c)(1),
(2), (4) Date: Jun. 27, 2013

(87) PCT Pub. No.: WO2013/137867
PCT Pub. Date: Sep. 19, 2013

(65) Prior Publication Data
US 2014/0218123 A1    Aug. 7, 2014

(51) Int. Cl.
| H03L 1/00 | (2006.01) |
| H03B 5/04 | (2006.01) |
| H03B 5/12 | (2006.01) |

(52) U.S. Cl.
CPC .............. *H03B 5/04* (2013.01); *H03B 5/1215* (2013.01); *H03B 5/1228* (2013.01); *H03B 5/1243* (2013.01); *H03B 5/1265* (2013.01)

(58) Field of Classification Search
CPC ...... H03B 5/04; H03B 5/1228; H03B 5/1215; H03B 5/1265; H03B 5/1243; H03L 1/021; H03L 1/022; H03L 1/023; H03L 1/025; H03L 1/026
USPC ........ 331/36 C, 66, 176, 117 R, 117 FE, 167, 331/177 V
See application file for complete search history.

(56) References Cited

U.S. PATENT DOCUMENTS

| 6,853,261 | B1 | 2/2005 | Ling | |
| 7,371,005 | B1 * | 5/2008 | Ahuja et al. | .................. 368/202 |
| 7,463,097 | B2 * | 12/2008 | Costa et al. | ..................... 331/14 |
| 7,583,154 | B1 | 9/2009 | Kizziar | |

(Continued)

FOREIGN PATENT DOCUMENTS

EP    1988628 A1    11/2008

OTHER PUBLICATIONS

International Search Report and Written Opinion mailed Nov. 28, 2012 for International Application No. PCT/US2012/028955, 12 pages.

(Continued)

*Primary Examiner* — Wesley E. Parker
*Assistant Examiner* — Richard Tan
(74) *Attorney, Agent, or Firm* — Schwabe Williamson & Wyatt PC

(57) ABSTRACT

A temperature compensation apparatus may include a sense circuit configured to produce a sense voltage that is dependent on temperature and a temperature compensation circuit configured to receive the sense voltage and produce a temperature compensation control signal to control a compensation capacitor array of an oscillator. The temperature compensation circuit may be configured to calibrate the control signal to have a first value at a first temperature. The temperature compensation circuit may also be configured to calibrate a trimming level (e.g., slope) of the control signal.

15 Claims, 6 Drawing Sheets

(56) References Cited

U.S. PATENT DOCUMENTS

| | | | |
|---|---|---|---|
| 2005/0073290 A1 | 4/2005 | Marinca et al. | |
| 2007/0096839 A1* | 5/2007 | Meissner | 331/176 |
| 2007/0233912 A1* | 10/2007 | Piasecki et al. | 710/61 |
| 2011/0260761 A1 | 10/2011 | Kearney et al. | |
| 2012/0262315 A1* | 10/2012 | Kapusta et al. | 341/110 |

OTHER PUBLICATIONS

International Preliminary Report on Patentability for PCT/US2012/028955, dated Sep. 25, 2014, 10 pages.

\* cited by examiner

TEMPERATURE COMPENSATION FOR OSCILLATOR

CROSS REFERENCE TO RELATED APPLICATION

The present application is a national phase entry under 35 U.S.C. §371 of International Application No. PCT/US2012/028955, filed Mar. 13, 2012, entitled "TEMPERATURE COMPENSATION FOR OSCILLATOR," which designates, among the various States, the United States of America, and the entire contents and disclosures of which are hereby incorporated by reference in their entireties.

TECHNICAL FIELD

This disclosure relates generally to electronic circuits. More particularly but not exclusively, the present disclosure relates to temperature compensation for oscillators.

BACKGROUND INFORMATION

The output frequency produced by oscillators, such as inductance-capacitance voltage-controlled oscillators (LC-VCOs), may shift with changing temperature. An LC-VCO phase-locked loop (PLL) may lose frequency locking due to the temperature shift, especially at high output frequencies.

BRIEF DESCRIPTION OF THE DRAWINGS

Non-limiting and non-exhaustive embodiments are described with reference to the following figures, wherein like reference numerals refer to like parts throughout the various views unless otherwise specified.

DETAILED DESCRIPTION

Embodiments of a method and apparatus for temperature compensation in an oscillator are described herein. In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Various embodiments may provide a temperature compensation apparatus, including a sense circuit configured to produce a sense voltage that is dependent on temperature, and a temperature compensation circuit configured to receive the sense voltage and produce a temperature compensation control signal to control a compensation capacitor array of an oscillator. The temperature compensation circuit may be configured to calibrate the control signal to have a first value at a first temperature. The temperature compensation circuit may also be configured to calibrate a trimming level (e.g., a gain and/or a slope) of the control signal.

The calibration may scale the control signal to within an operating range of the compensation capacitor array over a designated operating temperature range. In one embodiment, the designated operating temperature range may be about zero degrees to about 110 degrees Celsius.

Figure 1:
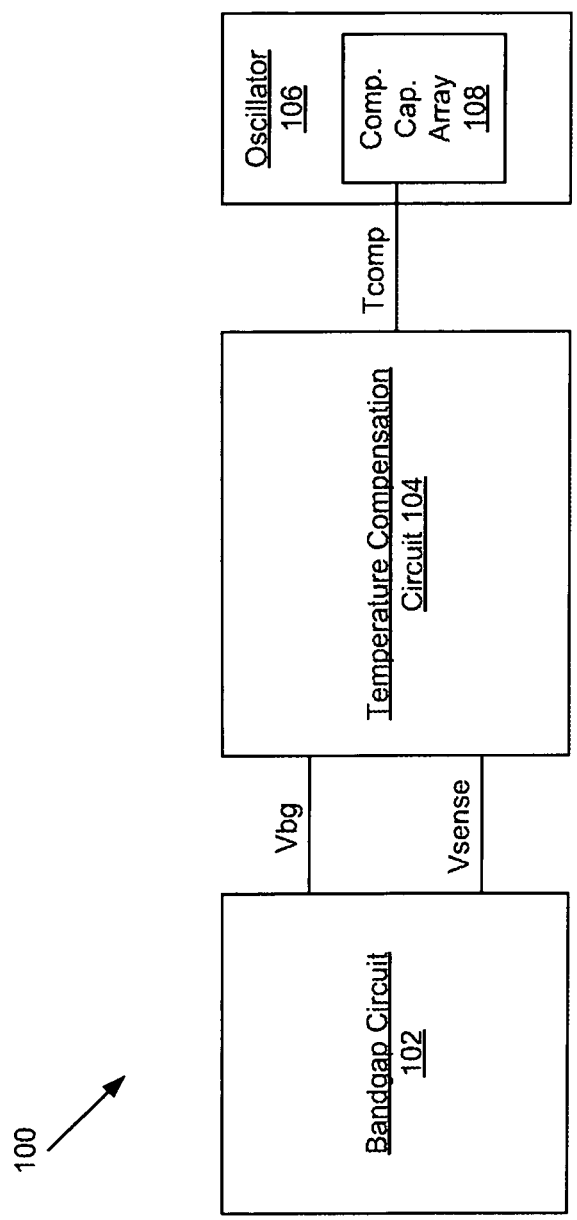
FIG. 1 is a block diagram that illustrates an electronic circuit including a bandgap circuit, a temperature compensation circuit, and an oscillator in accordance with various embodiments.

FIG. 1 illustrates a block diagram of a circuit 100 in accordance with various embodiments. The circuit 100 may include a bandgap circuit 102 (also referred to as a sense circuit) and a temperature compensation circuit 104. The bandgap circuit 102 may produce a bandgap voltage Vbg that is substantially independent of temperature (e.g., does not vary substantially with temperature) and a sense voltage Vsense that is dependent on temperature. In some embodiments, Vsense may be proportional to an absolute temperature (PTAT) voltage. In other embodiments, Vsense may be complementary to an absolute temperature (CTAT) voltage. In various embodiments, the temperature compensation circuit 104 may be coupled to the bandgap circuit 102 to receive the bandgap voltage Vbg and the sense voltage Vsense and may produce a temperature compensation control signal Tcomp. The temperature compensation circuit 104 may be coupled to an oscillator 106, and Tcomp may be sent to the oscillator 106 (e.g., an inductance-capacitance voltage-controlled oscillator (LC-VCO)) to control a compensation capacitor array 108 of the oscillator 106. The compensation capacitor array 108 may adjust the capacitance provided by oscillator 106 to compensate for temperature changes. This compensation may prevent an output frequency of the oscillator 106 from changing substantially due to changes in temperature.

In various embodiments, the temperature compensation control signal Tcomp may have a value equal to a difference between Vsense and a programmable adjustment voltage Vadj, the difference amplified by an amplification gain. As the value of Vsense changes with temperature, the value of Tcomp may also change, thereby providing temperature compensation for oscillator 106. In some embodiments, Tcomp may be an analog signal (e.g., an analog voltage control signal Vcomp). In other embodiments, Tcomp may be a digital signal (e.g., a digital control signal Tdig). In some embodiments, the digital control signal Tdig may be derived from the analog control signal Vcomp. As discussed herein, the temperature compensation control signal may refer to the analog control signal Vcomp and/or the digital control signal Tcdig.

Figure 2:
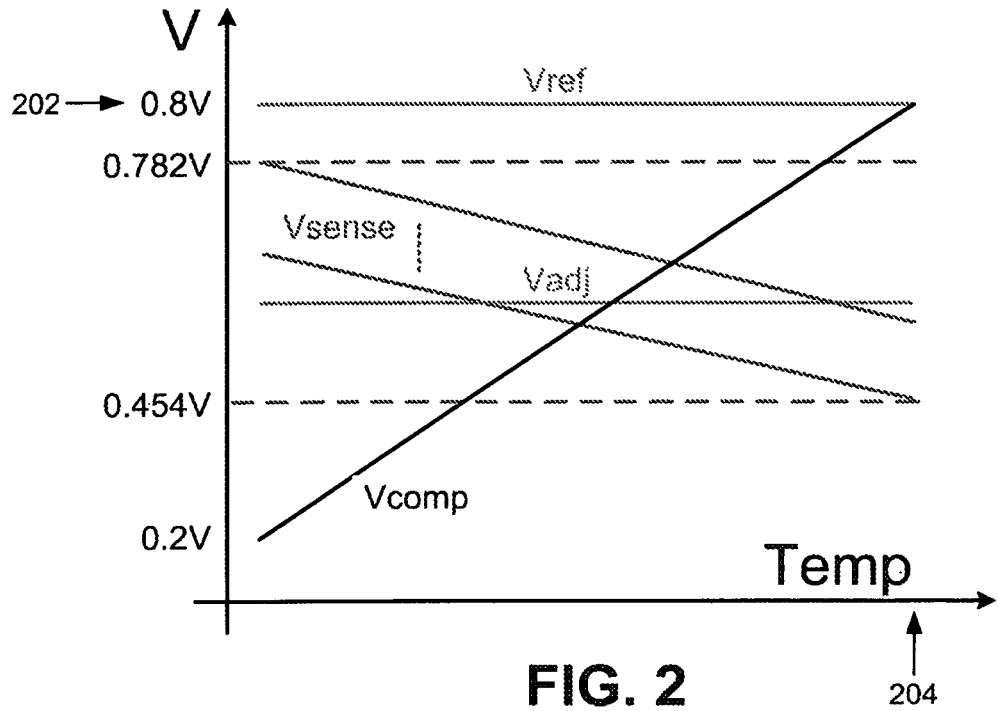
FIG. 2 illustrates examples of various signals used by the temperature compensation circuit to produce a temperature compensation signal Vcomp in accordance with various embodiments.

In various embodiments, the temperature compensation circuit 104 may set the value of Vadj during a calibration process. FIG. 2 shows examples of the signals Vsense, Vadj, Vcomp, and a reference voltage Vref according to one embodiment. The value of Vadj may be adjusted until the value of Vcomp is equal to the reference voltage Vref at a calibration temperature. The value of Vadj may then be fixed for normal operation of the oscillator 106.

As shown, the value of Vsense may vary across process, voltage, and/or temperature (PVT) corners. The calibration process may scale the Vcomp signal to have a designated first value 202 at a first temperature 204. In some embodiments, the first temperature may be set at an upper limit of a desired operating range, such as 110 degrees Celsius. Additionally, the first value may be set at an upper limit of the operating range of the calibration capacitor array 108. For example, Vref may be set at 0.8V, so that the value of Vcomp will be approximately 0.8V at 110 degrees Celsius.

In some embodiments, the calibration may be performed at the first temperature (e.g., the calibration temperature may equal the first temperature). In that case, the reference voltage may be set to have the first value.

In other embodiments, the calibration may be performed at a calibration temperature lower than the first temperature. In such embodiments, the value of Vref may be adjusted to compensate for a lower calibration temperature so that the control signal will still have the designated first value at the first temperature. For example, if it is desired for Vcomp to be about 0.8V at 110 degrees, and the calibration process is performed at a temperature of 90 degrees, Vref may be set to a lower value (e.g., about 0.7V). The value of Vref may also depend on a trimming level chosen for the control signal Vcomp, which is discussed further below.

Figure 3:
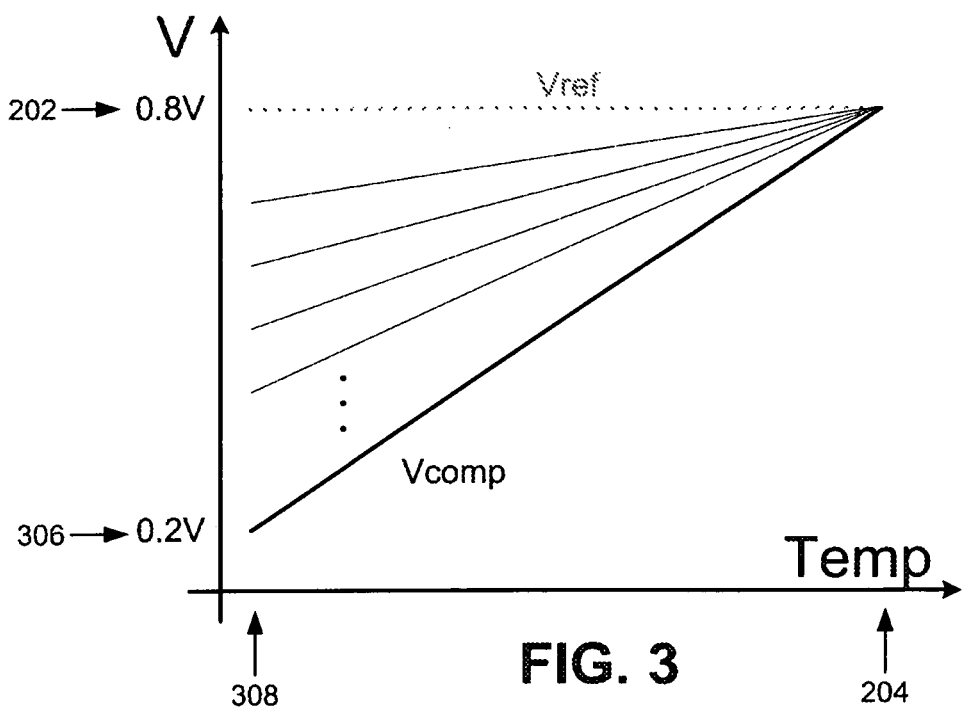
FIG. 3 illustrates the temperature compensation signal Vcomp subjected to various trimming levels in accordance with various embodiments.

In various embodiments, the amplification gain (also referred to as the trimming level) may also be set during the calibration process. FIG. 3 shows examples of Vcomp signals with different trimming levels. The value of Vadj may be adjusted so that the value of Vcomp at the first temperature is substantially equal to Vref (e.g., 0.8V). Adjusting the amplification gain may change the slope of the Vcomp signal. The trimming level may be determined through testing of the oscillator 106 depending on a level of temperature drift exhibited by the oscillator 106. A trimming level may be chosen which limits frequency drift over the operating temperature range to an acceptable level.

In some embodiments, the trimming level may initially be set so that the control signal Vcomp has a second value 306 at a second temperature 308. The second temperature may be a lower limit of the designated operating temperature range of the oscillator 106. The second value may be chosen to so that the control signal is within the range of useful input signals to control the compensation capacitor array 108 (e.g., to provide high variation in capacitance for compensation). For example, in one embodiment, the second value may be 0.2V at zero degrees Celsius. The trimming level may adjusted as necessary as explained above (e.g., depending on the amount of temperature drift exhibited by the oscillator 106).

In various embodiments, the calibration process may be performed prior to normal operation of the circuit 100 (e.g., by the manufacturer during sorting of the circuits 100) to set the value of Vadj and the trimming level. The value of Vadj and the trimming level may then be fixed for normal operation of oscillator 106.

Figure 4:
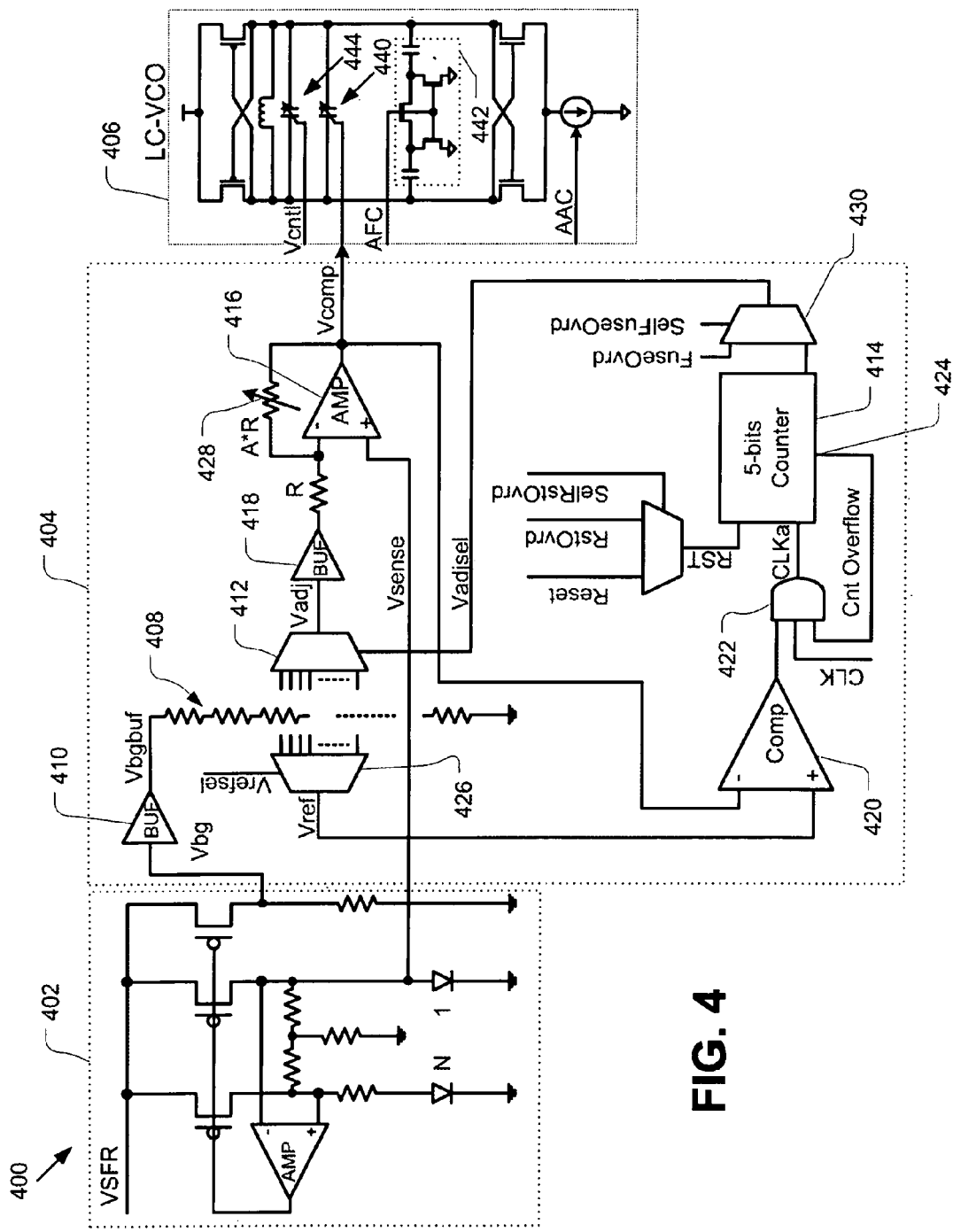
FIG. 4 illustrates a circuit diagram showing an example of the bandgap circuit, temperature compensation circuit, and oscillator from FIG. 1 in accordance with various embodiments.
Figure 5:
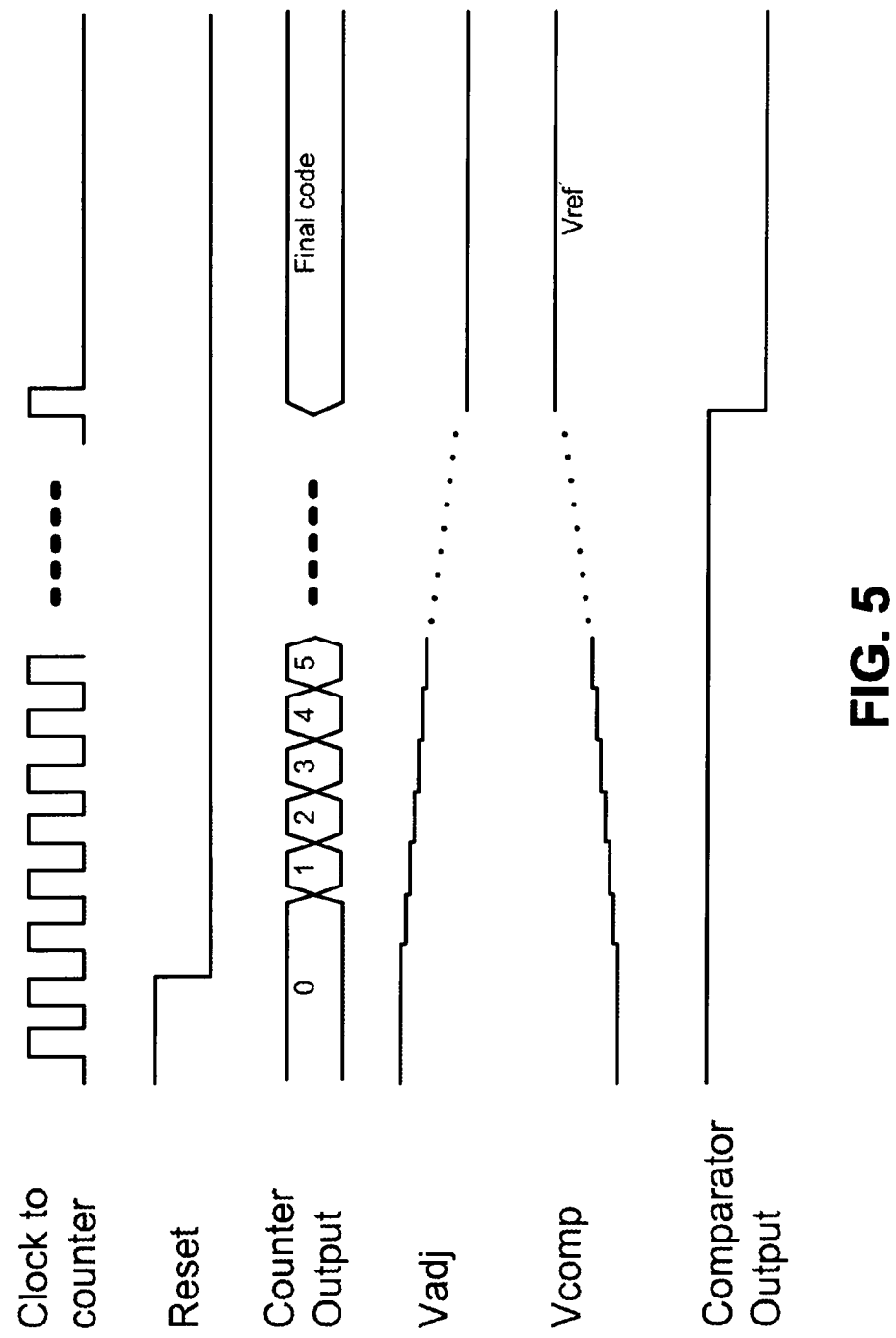
FIG. 5 illustrates example waveforms of the signals used and/or produced by the temperature compensation circuit of FIG. 4 in accordance with various embodiments.

FIG. 4 illustrates a circuit 400 showing an example implementation of the circuit 100. Circuit 400 may include a bandgap circuit 402, temperature compensation circuit 404, and VCO 406. Additionally, FIG. 5 illustrates waveforms of various signals used and/or produced during the calibration process as discussed below.

As shown in FIG. 4, the temperature compensation circuit 404 may include a resistor chain 408 for producing the Vadj signal with a range of values. The resistor chain 408 may receive the bandgap voltage Vbg from the bandgap circuit 402 (e.g., through a buffer 410). The resistor chain may be configured to produce a range of values of Vadj from the bandgap voltage Vbg. Accordingly, the values of Vadj may not change substantially with temperature.

A multiplexer 412 may be coupled to the resistor chain 408 to select the value of Vadj. A counter 414 may be coupled to the multiplexer to adjust the value of Vadj during the calibration process. The output of counter 414 may be initially reset (e.g., to zero) by a reset signal RST. The counter 414 may receive a clock signal CLKa and the output of counter 414 may increase with successive cycles of the clock signal CLKa. The output of counter 414 may be passed, through a fuse override multiplexer 430, to the multiplexer 412 as a Vadj select signal (Vadjsel). The multiplexer 412 may select the value of Vadj from the resistor chain 408 based on the Vadjsel signal. In one embodiment, as the value of Vadjsel increases, the value of Vadj may decrease.

In one embodiment, the counter 414 may be a 5-bit counter, and the multiplexer 412 may be a 32×1 multiplexer. Accordingly, the calibration process may be configured to produce 32 different values of Vadj. Any suitable increment between steps of Vadj may be used; such as about 10 milliVolts (mV).

The Vadj signal may be passed from multiplexer 412 to an amplifier 416 (e.g., through a buffer 418). The amplifier 416 may also receive the Vsense signal from the bandgap circuit 402. The amplifier 416 may amplify the difference between Vadj and Vsense by an amplification factor (e.g., gain) to produce the analog control signal Vcomp. Vcomp may be passed to a comparator 420 which compares Vcomp to the reference voltage Vref. If the output of the comparator 420 switches (e.g., from a logic 1 to a logic 0), the clock signal CLK may be prevented from being passed to the comparator 420, thereby causing the counter 414 to stop counting up (e.g., increasing the Vadjsel signal). The final value of Vadj may be the calibrated value of Vadj. The calibrated Vadj may be used to create the calibrated Vcomp signal.

In one embodiment, the output of the comparator 420 may be passed to an AND gate 422 that receives a clock signal CLK. The output of the comparator 420 may have a first logic state (e.g., a logic 1) if Vcomp is less than Vref, and a second logic state (e.g., a logic 0) if Vcomp is above Vref. Vcomp may initially be below Vref at the start of the calibration process, thereby causing the AND gate 422 to pass the clock signal CLK to the counter 414 as CLKa. If Vcomp rises above Vref, the output of the comparator 420 may switch, thereby preventing the clock signal CLK from being passed to the counter 414.

In some embodiments, a counter overflow output 424 may stop the counter from continuing to count up if the calibration process does not trigger the counter 414 to stop (e.g., if there is a problem with the VCO 406 and/or another part of the circuit 400).

As discussed above, the reset signal RST may be sent to the counter 414 to reset the counter output. A reset override signal (RstOvrd) may also be used to reset counter 414 for debugging and/or other purposes. A reset override selection signal (SelRstOvrd) may be used to override the reset and pass the RstOvrd signal to the counter 414.

As discussed above, the value of the reference voltage Vref may be adjusted if the calibration process is performed at a lower temperature than the upper temperature limit of the operating range of VCO 406. For example, Vref may be produced from the bandgap voltage Vbg by the resistor chain 408. A multiplexer 426 may be used to change the value of Vref (e.g., using a selection signal Vrefsel).

Additionally, as discussed above, the gain provided by amplifier 416 may be adjusted to change the trimming level of the temperature compensation signal Vcomp. A variable feedback resistor 428 may be used to adjust the gain of the amplifier 416.

As discussed above, the value of Vadj may be fixed at the calibrated value (e.g., the final value obtained during the calibration process described above) for normal operation of the VCO 406. Any suitable mechanism may be used for fixing the value of Vadj at the calibrated value.

For example, as shown in FIG. 4, the output of counter 414 may be passed to the multiplexer 430 (e.g., a 2×1 multiplexer). The calibrated value of Vadjsel may be written as a fuse value FuseOvrd that is also input to the multiplexer 430. A Fuse override selection signal SelFuseOvrd may be used to cause the multiplexer 430 to pass the FuseOvrd value to the multiplexer 412 as the Vadjsel signal rather than the counter output. Accordingly, the value of Vadj selected by the multiplexer 412 will be set at the calibrated value determined by the calibration process.

In some embodiments, the analog temperature compensation control signal Vcomp may be passed to a compensation capacitor array 440 (e.g., including one or more varactors). The analog control signal Vcomp may change the capacitance provided by compensation varactors 440 in response to changing temperature. This change may compensate for changes in the output frequency caused by changing temperature.

The VCO 406 may also include a coarse tuning capacitor array 442 (e.g., a switched capacitor bank) for coarse tuning of output frequency and a fine tuning capacitor array 444 (e.g., analog varactors) for fine tuning of output frequency. The coarse tuning capacitor array may be controlled by an auto-frequency control (AFC) signal, while the fine tuning capacitor array may be controlled by a control voltage Vcntl. The varactors of the compensation capacitor array 440 and/or fine tuning capacitor array 444 may also be referred to as analog varactors, and the capacitor bank of the coarse tuning capacitor array 442 may also be referred to as a metal figure capacitor bank and/or as a plurality of digital varactors.

Figure 6:
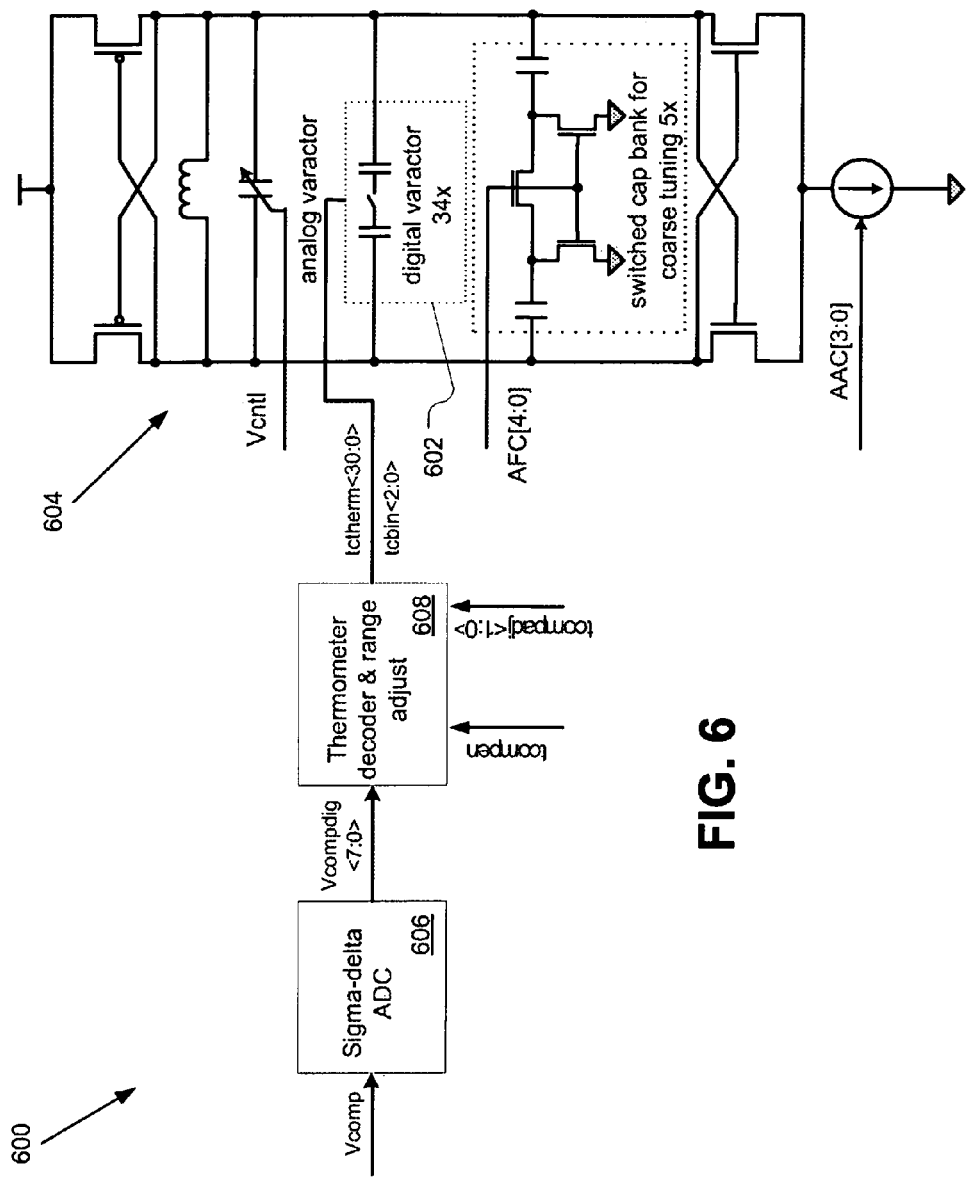
FIG. 6 illustrates a block diagram of a portion of a temperature compensation circuit configured to produce a digital control signal in accordance with various embodiments.

In other embodiments, the analog voltage control signal Vcomp may be converted to a digital control signal Tcdig to control a set of digital compensation varactors. FIG. 6 shows a portion of a temperature compensation circuit 600. The temperature compensation circuit 600 may be employed in conjunction with the temperature compensation circuit 404 of FIG. 4 to convert the analog control signal Vcomp into a digital control signal Tcdig. The digital control signal Tcdig may be used to control a switched capacitor bank 602 (e.g., a plurality of digital varactors) in a VCO 604. The digital compensation scheme shown in FIG. 6 may be used in addition to or instead of the analog compensation scheme shown in FIG. 4.

The temperature compensation signal Vcomp may be converted to a digital signal Vcompdig by an analog-to-digital converter (ADC) 606. In one embodiment, the ADC may be a Sigma-Delta ADC. In one embodiment, the ADC may be an 8-bit ADC, producing a Vcompdig signal with eight bits. The Vcdig signal may be passed to a decoder module 608.

The decoder module 608 may convert the Vcompdig signal into the digital control signal Tcdig used to control the capacitor bank 602. In some embodiments, the control signal may include two parts: a temperature code (tctherm) and a binary code (tcbin). In other embodiments, the control signal may include only one of the temperature code and/or binary code. The binary code may include one or more of the least significant bits of Vcompdig. For example, for an 8-bit Vcompdig code, the binary code may include the three least significant bits of Tcompdig. The remaining most-significant bits (e.g., the five most significant bits) may be converted into the temperature code.

The temperature code may be decoded from the group of most significant bits so that the temperature code includes the same quantity of bits as the maximum value represented by the group of most significant bits. For example, if the five most significant bits are used to produce the temperature code, the temperature code may include 31 bits (since a binary code of five "1's" is equal to 31). The temperature code may include a quantity of logic 1 bits equal to the number decoded in the group of most significant bits. For example, if the five most significant bits of Vcompdig are [1 1 0 0 1], then the temperature code may include 25 bits of logic 1 and 6 bits of logic 0.

In some embodiments, the decoder module 608 may be configured to receive an enable signal tcompen to turn temperature compensation on and/or off. Additionally, a compensation adjustment signal tcompadj may be used to adjust the amount of temperature compensation (e.g., trimming). In one embodiment, the tcompadj signal may include two control bits, providing four levels of temperature compensation.

The digital control control signal Tcdig (including the binary code and temperature code) may be used to control the switched capacitor bank 602 in the VCO 604. The capacitor bank 602 may include a quantity of switches equal to the number of bits in the control code (e.g., 34 in the current example). Each bit of the control code may control a different switch in the capacitor bank 602. The switches for the temperature code may each control a capacitance value of 8C (in relative units), while the three bits in the binary code may control capacitance values of 1C, 2C, and 4C respectively (e.g., corresponding to their binary values). Accordingly, the control code may be used to convert the 8-bit Tcdig code to provide 256 levels of capacitance from the capacitor bank 602.

The two-part control code may save layout area (by requiring fewer switches and/or capacitors) and/or maintain monotonicity of the capacitor bank 602. It will be apparent that other arrangements of the makeup of the control code and the relative values of the legs of the capacitor bank 602 are possible.

Embodiments of the oscillator with temperature compensation circuit described herein may be used in a number of implementations and applications. For example, mobile devices, including but not limited to smart phones, nettops, tablets and other Mobile Internet Devices (MIDs), may include one or more oscillators for use with transmitting and/or receiving data signals over a wireless and/or wired communication network. Additionally, a microprocessor may include one or more oscillators for input and/or output of data. A temperature compensation circuit as described herein may be coupled to one or more of the oscillators to compensate the oscillator output frequency under varying temperature conditions.

Figure 7:
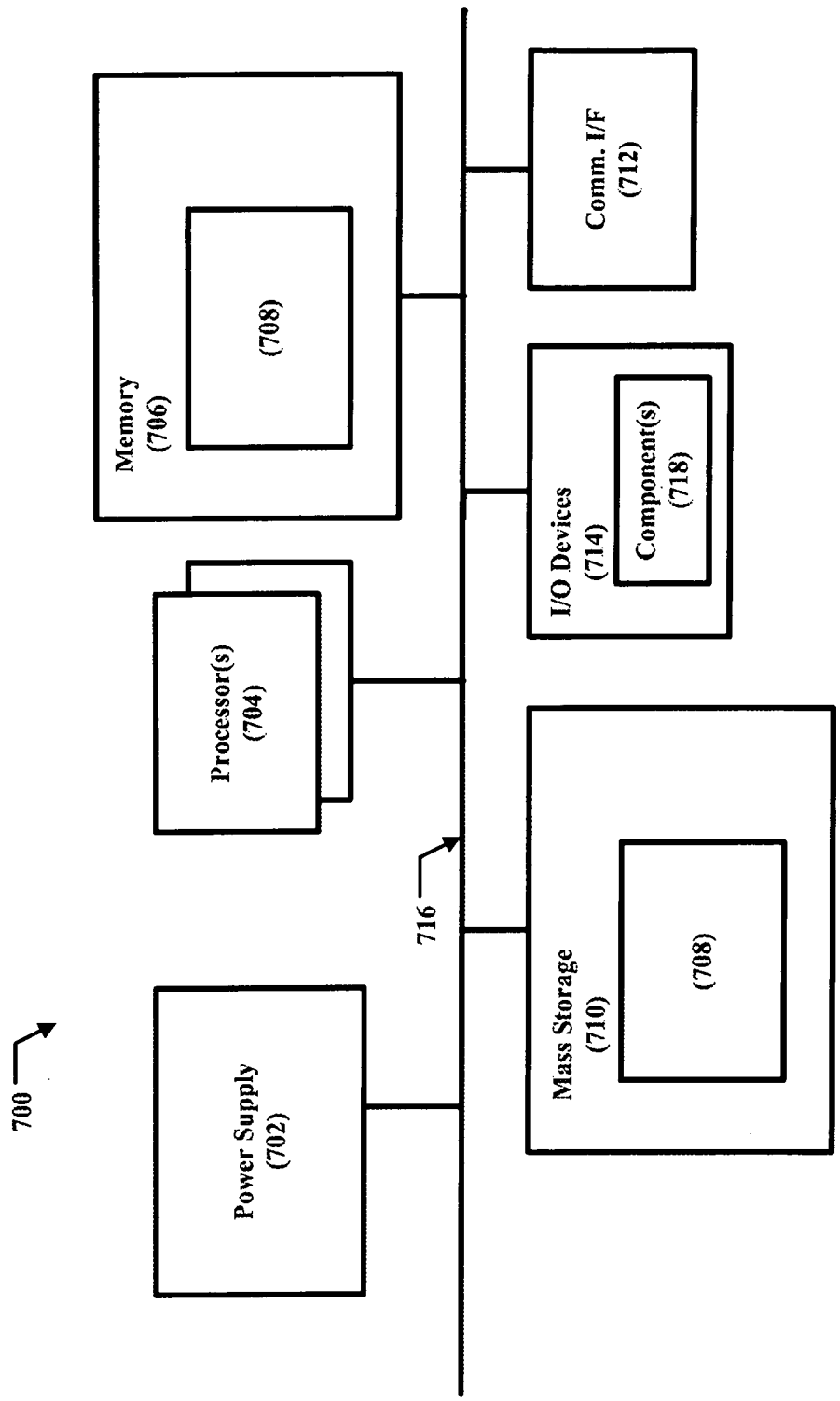
FIG. 7 is a block diagram that illustrates an example computing system suitable to practice the disclosed embodiments.

FIG. 7 is a block diagram that illustrates an example computer system 700 suitable to practice the disclosed temperature compensation circuit/method of various embodiments. As shown, the computer system 700 may include a power supply unit 702, a number of processors or processor cores 704, a system memory 706 having processor-readable and processor-executable instructions 708 stored therein, a mass storage device 710 that may also store the instructions 708, and a communication interface 712. For the purpose of this application, including the claims, the terms "processor" and "processor cores" may be considered synonymous, unless the context clearly requires otherwise.

The one or more mass storage devices 710 and/or the memory 706 may comprise a tangible, non-transitory computer-readable storage device (such as a diskette, hard drive, compact disc read only memory (CDROM), hardware storage unit, and so forth). The computer system 700 may also comprise input/output devices 714 (such as a keyboard, display screen, cursor control, and so forth). According to various embodiments, one or more of the depicted components of the system 700 and/or other element(s) may include a keyboard, LCD screen, non-volatile memory port, multiple antennas, graphics processor, application processor, speakers, or other associated mobile device elements, including a camera.

In various embodiments, the communications interface 712, at least one processor 704 and/or other component(s) 718 may include a temperature compensation circuit (such as the temperature compensation circuit 104 of FIG. 1, 404 of FIG. 4, and/or 604 of FIG. 6) coupled to an oscillator (e.g., a VCO) to compensate the oscillator under varying temperature conditions. The oscillator may be coupled to the at least one processor 704 and/or other component(s) 718. According to various embodiments, the oscillator may be coupled to the processor 704 by being contained within the processor 704 or the oscillator may be coupled to the processor 704 by being located externally to the processor 704. The temperature compensation circuit and/or oscillator may alternatively or additionally be located elsewhere in the computer system 700, and may comprise part or all of an integrated circuit.

The various elements of FIG. 7 may be coupled to each other via a system bus 716, which represents one or more buses. In the case of multiple buses, they may be bridged by one or more bus bridges (not shown). Data may pass through the system bus 716 through the I/O devices 714, for example, between the component(s) 718 and the processors 704.

The system memory 706 and the mass storage device 710 may be employed to store a working copy and a permanent copy of the programming instructions implementing one or more operating systems, firmware modules or drivers, applications, and so forth, herein collectively denoted as 708. The permanent copy of the programming instructions may be placed into permanent storage in the factory, or in the field, through, for example, a distribution medium (not shown), such as a compact disc (CD), or through the communication interface 712 (from a distribution server (not shown)).

The remaining constitution of the various elements of the computer system 700 is known, and accordingly will not be further described in detail.

The above description of illustrated embodiments, including what is described in the Abstract, is not intended to be exhaustive or to be limited to the precise forms disclosed. While specific embodiments and examples are described herein for illustrative purposes, various modifications are possible. For example, the configuration and connection of certain elements in various embodiments have been shown or described above in the context of high/low values of signals, responses to rising/falling edges of signals, inverters to invert signals, P-type and N-type transistors, and so forth. In other embodiments, different configurations can be provided in view of whether N-type transistors are used instead of P-type transistors, whether or not certain signals are inverted, whether certain changes in state are triggered in response to falling edges instead of rising edges or vice versa, and so forth.

These and other modifications can be made in light of the above detailed description. The terms used in the following claims should not be construed to be limited to the specific embodiments disclosed in the specification.

What is claimed is:

1. A temperature compensation apparatus, comprising:
   a sense circuit configured to produce a sense voltage that is dependent on temperature; and
   a temperature compensation circuit coupled to the sense circuit and configured to receive the sense voltage and to produce a temperature compensation control signal to control a compensation capacitor array of an oscillator so as to adjust an output frequency of the oscillator in response to the temperature;
   wherein the temperature compensation circuit is configured to calibrate the temperature compensation control signal to have a first value at a first temperature;
   wherein, to calibrate the temperature compensation control signal, the temperature compensation circuit is to:
   produce a control signal that corresponds to a difference between an adjustment voltage and the sense voltage amplified by a gain, wherein the adjustment voltage is independent of temperature; and
   adjust the adjustment voltage until the control signal is substantially equal to a reference voltage to obtain a calibrated value of the adjustment voltage; and
   wherein the temperature compensation control signal is a digital signal that includes a temperature code and a binary code, the temperature code to control a plurality of digital varactors of the compensation capacitor array having a first capacitance value, and the binary code to control a plurality of digital varactors of the compensation capacitor array having values less than the first capacitance value.

2. The apparatus of claim 1, wherein the first temperature comprises an upper limit of an operating temperature range of the oscillator.

3. The apparatus of claim 1, wherein a trimming level of the temperature compensation control signal is adjustable.

4. The apparatus of claim 1, wherein the binary code includes at least three bits, the at least three bits including:
   a first bit configured to control a first digital varactor having a capacitance value of one-half the first capacitance value;
   a second bit configured to control a second digital varactor having a capacitance value of one-fourth the first capacitance value; and
   a third bit configured to control a third digital varactor having a capacitance value of one-eighth of the first capacitance value.

5. The apparatus of claim 1, wherein the sense voltage comprises a proportional-to-absolute-temperature (PTAT) voltage.

6. The apparatus of claim 1, wherein the temperature compensation circuit is configured to calibrate the temperature compensation control signal at the first temperature.

7. The apparatus of claim 1, wherein the temperature compensation circuit is configured to calibrate the temperature compensation control signal at a second temperature that is less than the first temperature.

8. A method for temperature compensation, comprising:
receiving a sense voltage dependent on temperature;
producing a control signal by amplifying a difference between an adjustment voltage and the sense voltage by a gain;
calibrating the control signal to have a first value at a first temperature, wherein the calibrating the control signal includes adjusting the adjustment voltage until the control signal is substantially equal to a reference voltage to obtain a calibrated value of the adjustment voltage;
converting the control signal to a temperature compensation control signal configured to control a compensation capacitor array of an oscillator so as to adjust an output frequency of the oscillator in response to the temperature, wherein the temperature compensation control signal is a digital signal that includes a temperature code and a binary code, the temperature code to control a plurality of digital varactors of the compensation capacitor array having a first capacitance value, and the binary code to control a plurality of digital varactors of the compensation capacitor array having values less than the first capacitance value.

9. The method for temperature compensation of claim 8, further comprising calibrating a gain of the control signal.

10. The method of claim 8, wherein the calibrating is performed at the first temperature, and wherein the reference voltage is substantially equal to the first value.

11. The method of claim 8, wherein the calibrating is performed at a second temperature that is less than the first temperature, and wherein the calibrating further includes setting a value of the reference voltage so that the control signal will have the first value at the first temperature.

12. A system, comprising:
a processor;
a voltage-controlled oscillator (VCO) coupled to the processor, the VCO including a compensation capacitor array that includes a plurality of digital varactors;
a bandgap circuit configured to produce a sense voltage that is dependent on a current temperature and a bandgap voltage that is substantially independent of temperature; and
a temperature compensation circuit coupled to the bandgap circuit, the temperature compensation circuit configured to:
produce a control signal that corresponds to a difference between an adjustment voltage and the sense voltage amplified by a gain, wherein the adjustment voltage is independent of temperature;
calibrate the control signal to have a first value at a first temperature by adjusting the adjustment voltage until the control signal is substantially equal to a reference voltage to obtain a calibrated value of the adjustment voltage; and
produce a digital control signal from the control signal to control the compensation capacitor array so as to adjust an output frequency of the VCO in response to the temperature;
wherein the plurality of digital varactors include:
a plurality of first digital varactors having a first capacitance value;
a second digital varactor having a second capacitance value equal to one-half the first capacitance value; and
a third digital varactor having a capacitance value equal to one-fourth the first capacitance value.

13. The system of claim 12, wherein the first temperature comprises an upper limit of an operating temperature range of the VCO.

14. The system of claim 12, wherein the VCO further includes a coarse tuning capacitor array and a fine tuning capacitor array.

15. The system of claim 12, wherein the temperature compensation circuit is configured to calibrate the control signal at a second temperature that is less than the first temperature.

* * * * *